United States Patent
Tsai et al.

(10) Patent No.: US 6,261,977 B1
(45) Date of Patent: Jul. 17, 2001

(54) METHOD FOR PREVENTING AN ELECTROSTATIC CHUCK FROM BEING CORRODED DURING A CLEANING PROCESS

(75) Inventors: Cheng-Yuan Tsai, Yun-Lin Hsien; Chih-Chien Liu, Taipei; Juan-Yuan Wu, Hsin-Chu, all of (TW)

(73) Assignee: United Microelectronics Corp., Hsin-chu (TW)

( * ) Notice: Subject to any disclaimer, the term of this patent is extended or adjusted under 35 U.S.C. 154(b) by 0 days.

(21) Appl. No.: 09/391,357

(22) Filed: Sep. 8, 1999

(51) Int. Cl.[7] .................................................. H01L 21/324
(52) U.S. Cl. .......................... 438/798; 438/905; 438/906; 438/907
(58) Field of Search .................................. 438/798, 905, 438/906, 907

(56) References Cited

U.S. PATENT DOCUMENTS 5,606,485 * 2/1997 Shamouilian et al. ............... 361/234
5,870,271 * 2/1999 Herchen ................................ 361/234

* cited by examiner

Primary Examiner—Richard Booth
Assistant Examiner—Lynne Gurley
(74) Attorney, Agent, or Firm—Winston Hsu

(57) ABSTRACT

The present invention relates to a method for preventing an electrostatic chuck positioned at the bottom of a plasma vacuum chamber from being corroded during a cleaning process. The electrostatic chuck comprises a conductive substrate functioned as a lower electrode in a plasma process, and an insulating layer on the conductive substrate to electrically isolate the semiconductor wafer and the conductive substrate. The cleaning process involves a plasma process in which a fluorine-contained gas is injected into the plasma vacuum chamber to remove the chemical layer on the inner wall of the plasma vacuum chamber. A ceramic shutter made of SiC material is reposed on the electrostatic chuck and a high DC voltage is applied to the conductive substrate and the ceramic shutter which causes the ceramic shutter and the electrostatic chuck tightly stick together due to an electrostatic reaction. By doing so, the fluorine-contained gas cannot corrode the insulating layer under the ceramic shutter through the gap between the ceramic shutter and the electrostatic chuck.

4 Claims, 2 Drawing Sheets

METHOD FOR PREVENTING AN ELECTROSTATIC CHUCK FROM BEING CORRODED DURING A CLEANING PROCESS

FIELD OF THE INVENTION

The present invention relates to a method for reventing corrosion, and more particularly, to a method for preventing an electrostatic chuck from being corroded during a cleaning process.

DESCRIPTION OF THE PRIOR ART

In semiconductor processing, HDPCVD (high density plasma chemical vapor deposition) is performed in a plasma vacuum chamber to form a thin film on the semiconductor wafer by depositing. But the reactive gas also deposits on the inner wall of the plasma vacuum chamber causing unwanted buildup. Therefore, most plasma vacuum chambers come equipped with self-cleaning devices that clean the chamber. This improves the yield of the products on the process and prolongs the service life of the chamber.

Please refer to FIG. 1. FIG. 1 is schematic diagram of the electrostatic chuck 10 according to the prior art. The electrostatic chuck 10 is located at the bottom of a plasma vacuum chamber (not shown) for placing a semiconductor wafer. The electrostatic chuck 10 comprises a metallic circular plate 14 functioned as a lower electrode during the HDPCVD process, and an insulating layer 12 covering the surface of the metallic circular plate 14 for electrically isolating the semiconductor wafer 10 and the metallic circular plate 14. The electrostatic chuck 10 contains a plurality of vent holes 17 through which a cooling gas passes to the semiconductor wafer and a plurality of channels 18 arranged in a radiating pattern for guiding the cooling gas.

During the HDPCVD process, the inner wall of the plasma vacuum chamber is also being deposited, and this deposited layer increases with increased frequency of use of the plasma vacuum chamber. So it is necessary to clean the plasma vacuum chamber at a certain accumulated thickness properly to maintain the quality of the process and to prolong the service life of the plasma vacuum chamber. In the cleaning process of the plasma vacuum chamber, a fluorine-contained gas is injected into the plasma vacuum chamber for performing a cleaning process to remove the chemical layer from the inner wall of the plasma vacuum chamber. If the product of the HDPCVD process is related to silicon oxide, $NF_3$ gas can be used as the plasma reactive gas. But in the cleaning process, the plasma gas is subject to corrode the electrostatic chuck 10 reposed in the plasma vacuum chamber. Therefore, before the cleaning process, measures to safeguard the electrostatic chuck need to be taken.

Please refer to FIG. 2. FIG. 2 is a schematic diagram of the method of preventing the electrostatic chuck 10 from being corroded during the cleaning process according to the prior art. In the method of the prior art, a ceramic shutter 16 made of $Al_2O_3$ is reposed on the electrostatic chuck 10 before the cleaning process is performed to isolate it from the fluorine-contained gas and to prevent the surface of the electrostatic chuck 10 from being corroded caused by the fluorine ions. But since the ceramic shutter 16 rests on the electrostatic chuck 10 by relying only on the gravitational force, thereby, fluorine ions can probably flow into the gap between the ceramic shutter 16 and the insulating layer 12 to corrode the periphery of the electrostatic chuck 10.

For a long period of time under the condition of corrosion, the difference in flatness of the electrostatic chuck 10 at the periphery and at the center portion will become significant. As a result, the periphery of the semiconductor wafer 10 may become suspended from the surface of chuck, thereby, the semiconductor wafer may not be able to be well fixed on the electrostatic chuck 10, leading to an unstable film's quality. For example, during the HDPCVD process, the cooling gas passing through the vent holes 17 and channels 18 of the electrostatic chuck 10 is not evenly distributed over the back face of the semiconductor wafer, so the temperature in different areas of the semiconductor wafer will not be the same, thus leading to inconsistency of the deposition rate.

SUMMARY OF THE INVENTION

It is therefore a primary objective of the present invention to provide a method for preventing an electrostatic chuck from being corroded during a cleaning process to resolve the above-mentioned problem.

In a preferred embodiment of the present invention, the method for preventing an electrostatic chuck from being corroded during a cleaning process, the electrostatic chuck being locating at the bottom of a plasma vacuum chamber for placing a semiconductor wafer and comprising a conductive substrate functioned as a lower electrode in a plasma process, and an insulating layer on the conductive substrate to electrically isolate the semiconductor wafer and the conductive substrate, the cleaning process involving a plasma process in which a fluorine-contained gas is injected into the plasma vacuum chamber, the method comprising:

placing a ceramic shutter on the electrostatic chuck during the cleaning process and applying a DC (direct current) voltage to the conductive substrate and the ceramic shutter which causes the ceramic shutter and the electrostatic chuck tightly stick together through an electrostatic force such that the fluorine-contained gas cannot corrode the insulating layer under the ceramic shutter through the gap between the ceramic shutter and the electrostatic chuck.

It is an advantage of the present invention that the ceramic shutter can stick on the electrostatic chuck 10 tightly to prevent the fluorine-contained gas from flowing into the gap between the ceramic shutter 16 and the electrostatic chuck 10.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
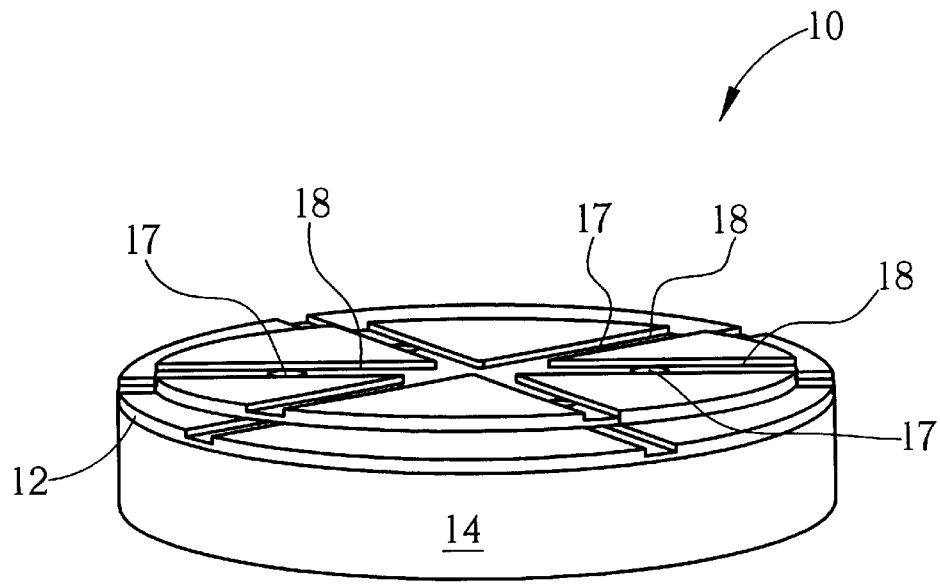
FIG. 1 is a schematic diagram of the electrostatic chuck 10 according to the prior art.
Figure 2:
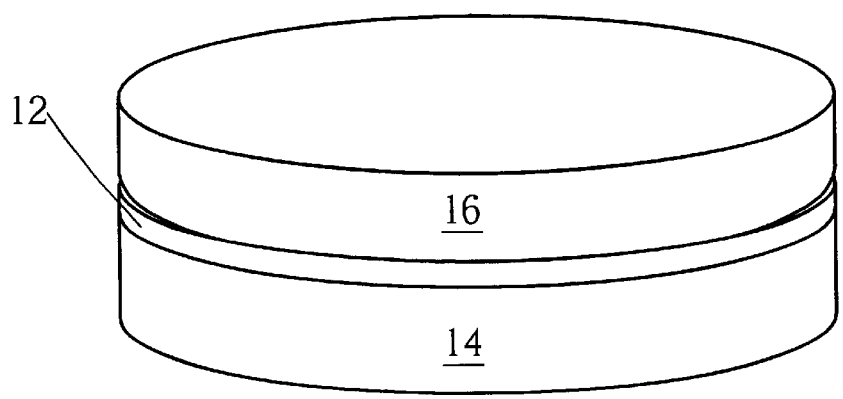
FIG. 2 is a schematic diagram of the method of preventing the electrostatic chuck 10 shown in FIG.1 from being corroded during the cleaning process according to the prior art.
Figure 3:
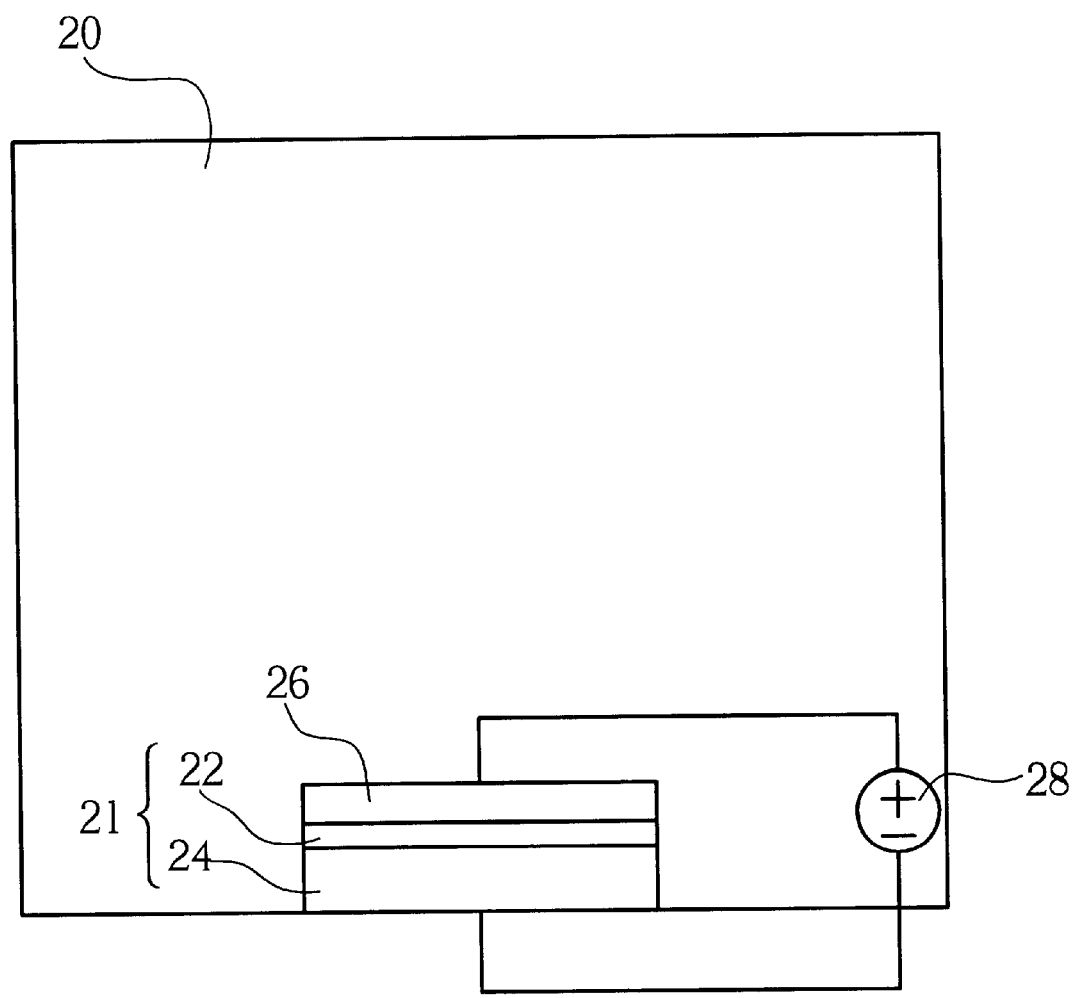
FIG. 3 is a schematic diagram of the method of preventing the electrostatic chuck from being corroded during the cleaning process according to the present invention.

Please refer to FIG. 3. FIG. 3 is a schematic diagram of the method of preventing the electrostatic chuck from being corroded during the cleaning process according to the present invention. The electrostatic chuck 21 is a circular plate positioned at the bottom of a plasma vacuum chamber of the HDPCVD process for loading a semiconductor wafer (not shown). The electrostatic chuck 21 comprises a conductive substrate 24 functioned as a lower electrode in a plasma process, and an insulating layer 22 on the conductive substrate 24 to electrically isolate the semiconductor wafer and the conductive substrate 24. When a bias voltage is applied to the semiconductor wafer and the conductive substrate 24, the insulating layer 22 and the semiconductor wafer will stick together due to the electrostatic attraction. The electrostatic chuck 21 is similar to the electrostatic chuck 10 in FIG.2 which contains a plurality of vent holes through which a cooling gas is inducted to the semiconductor wafer reposed on the electrostatic chuck during a plasma process and a plurality of channels arranged in a radiating pattern for guiding the cooling gas.

In the first step of the method of the present invention, a ceramic shutter 26 made of SiC(silicon carbon) is reposed on the electrostatic chuck 21. The ceramic shutter 26 is a circular plate that can completely covers the surface of the electrostatic chuck 21. Then, a high DC (direct current) voltage 28 is applied to the conductive substrate 24. The ceramic shutter 26 will cause the ceramic shutter 26, which is induced by the electrostatic force, to tightly stick to the surface of the electrostatic chuck 21 since the SiC is a material having good corrosion resistance and good conductivity. Thereafter, a cleaning process is performed. $NF_3$ gas, which is a fluorine-contained gas, is injected into the plasma vacuum chamber 20 for performing a plasma process of dry etching to remove the deposited layer from the inner wall of the plasma vacuum chamber 20.

Since the ceramic shutter 26 is tightly stuck to the electrostatic chuck 21, the fluorine-contained gas is not able to corrode the insulating layer 22 located beneath the ceramic shutter 26 through the gap between the ceramic shutter 26 and the electrostatic chuck 21, thereby, the periphery of the electrostatic chuck 21 will not be corroded by the plasma gas enabling the consistency of flatness on the periphery and the center portion of the electrostatic chuck 21. By using the method of the present invention to perform the cleaning process, corrosion of the electrostatic chuck 21 during the cleaning process can be avoided.

In contrast to the prior art, the present invention utilizes a ceramic shutter 26 made of SiC material having good corrosion resistance and good conductivity to completely cover the electrostatic chuck 21. A high DC voltage 28 is then applied to cause the ceramic shutter 26 to tightly stick to the surface of the electrostatic chuck 21 due to an electrostatic force to prevent any gaps from forming between the ceramic shutter 26 and the electrostatic chuck 21. Therefore, the fluorine-contained gas cannot corrode the insulating layer 22 located beneath the ceramic shutter 26 through the gap between the ceramic shutter 26 and the electrostatic chuck 21.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for preventing an electrostatic chuck from being corroded during a cleaning process, the electrostatic chuck being positioned at the bottom of a plasma vacuum chamber for reposing a semiconductor wafer and comprising a conductive substrate functioned as a lower electrode in a plasma process, and an insulating layer on the conductive substrate to electrically isolate the semiconductor wafer and the conductive substrate, the cleaning process involving a plasma process in which a fluorine-contained gas is injected into the plasma vacuum chamber, the method comprising:

placing a ceramic shutter with a circular plate shape to completely cover the surface of the electrostatic chuck during the cleaning process and applying a DC (direct current) voltage to the conductive substrate and the ceramic shutter which causes the ceramic shutter and the electrostatic chuck to tightly stick together through an electrostatic reaction such that the fluorine-contained gas cannot corrode the insulating layer under the ceramic shutter through the gap between the ceramic shutter and the electrostatic chuck.

2. The method of claim 1 wherein the electrostatic chuck contains a plurality of vent holes for inducting a cooling gas to the semiconductor wafer reposed on the electrostatic chuck during a plasma process and a plurality of slots arranged in a radiating pattern for guiding the cooling gas.

3. The method of claim 1 wherein the fluorine-contained gas is $NF_3$.

4. The method of claim 1 wherein the plasma vacuum chamber is used for performing a high density plasma chemical vapor deposition (HDPCVD) process.

* * * * *